United States Patent
Kitajima (10) Patent No.: US 9,559,055 B2
(45) Date of Patent: Jan. 31, 2017

(54) SEMICONDUCTOR DEVICE (71) Applicant: SEIKO INSTRUMENTS INC., Chiba-shi, Chiba (JP)

(72) Inventor: Yuichiro Kitajima, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/602,516

(22) Filed: Jan. 22, 2015

(65) Prior Publication Data
US 2015/0221594 A1    Aug. 6, 2015

(30) Foreign Application Priority Data

Jan. 31, 2014    (JP) ................................ 2014-017548

(51) Int. Cl.
*H01L 23/525*    (2006.01)
(52) U.S. Cl.
CPC ... *H01L 23/5258* (2013.01); *H01L 2924/0002* (2013.01)
(58) Field of Classification Search
CPC ............ H01L 23/5256; H01L 23/5254; H01L 23/5258; H01L 23/62; H01L 27/11206
See application file for complete search history.

(56) References Cited

U.S. PATENT DOCUMENTS

| 5,608,257 A * | 3/1997 | Lee ..................... H01L 23/5258 257/208 |
| 6,204,548 B1 * | 3/2001 | Komai ............... H01L 23/5258 257/209 |
| 6,667,533 B2 * | 12/2003 | Daubenspeck et al. ...... 257/529 |

FOREIGN PATENT DOCUMENTS

| JP | 06252268 A * | 9/1994 | ............ H01L 21/82 |
| JP | 2011049252 | 3/2011 | |
| JP | 2011049252 A * | 3/2011 | |

OTHER PUBLICATIONS

Patent Abstracts of Japan, Publication No. 2011-049252, Publication Date Mar. 10, 2011.

* cited by examiner

*Primary Examiner* — Su C Kim
*Assistant Examiner* — David S Wilbert
(74) *Attorney, Agent, or Firm* — Adams & Wilks

(57) ABSTRACT

A semiconductor device includes a fuse element that can be cut and removed by laser irradiation. The fuse element has a large width portion having a large sectional area to be irradiated with a laser spot, and two small width portions having a small sectional area connected to opposite sides of the large width portion. Penetration of moisture is suppressed even after cutting of the fuse element since the large width portion is removed by the laser irradiation and only the small width portions having the small sectional area remain as exposed cut surfaces.

7 Claims, 6 Drawing Sheets

SEMICONDUCTOR DEVICE

BACKGROUND OF THE INVENTION

1. Field of the Invention

The present invention relates to a semiconductor device, in particular, a semiconductor device including a fuse element that can be cut for changing a circuit configuration of the semiconductor device.

2. Description of the Related Art

There is a method of changing a circuit configuration of a semiconductor device by cutting, in a semiconductor device manufacturing process, a fuse element formed of polysilicon, metal, and the like by using, for example, a laser after a wafer manufacturing process is finished. By using this method, a resistance value can be corrected to obtain desired characteristics after electrical characteristics of the semiconductor device are measured. This method is thus effective particularly for a semiconductor device that places emphasis on its analog characteristics.

In this method, it is required for the fuse element to be stably cut by the laser and have a high corrosion resistance. Hitherto, an insulating protective film is formed on an upper portion of a semiconductor device, and, for example, a silicon nitride film is used for the purpose of preventing the penetration of moisture from the outside and other purposes. However, because a fuse element is supposed to be cut by laser irradiation later, the silicon nitride film that absorbs the laser cannot be arranged on the fuse element, and hence the protective film formed above the fuse element is removed so as to open the protective film. Therefore, the fuse element is easily affected by the penetration of moisture and needs to have an improved corrosion resistance.

In Japanese Patent Application Laid-open No. 2011-49252, there is proposed a method of improving a corrosion resistance by forming a moisture resistance insulating film such as a silicon nitride film or a silicon oxynitride film on at least a side surface of a fuse element, or on the side surface and an upper portion of the fuse element in such a manner that the moisture resistance insulating film is thinner on the upper portion than on the side surface.

However, the above-mentioned related art has the following problems. Although moisture basically penetrates from a portion above the fuse element from which the protective film is removed, in the method, no moisture resistance insulating film is arranged or the thin moisture resistance insulating film is formed on the upper portion of the fuse element. Therefore, the protection of the upper portion is insufficient. Further, because the silicon nitride film or the silicon oxynitride film is used as the moisture resistance insulating film, the radiated laser beam is absorbed, which makes it difficult to cut the fuse. In this method, the moisture resistance improvement and the stability of cutting the fuse element by the laser have a trade-off relationship. It is considered that obtaining a condition that satisfies both requirements is difficult to achieve. In particular, the related-art configuration focuses only on an uncut fuse element and has no effect on a fuse element cut by the laser. This is because, when the fuse element is cut, the fuse element is exposed from the cut surface to cause corrosion. The fuse element is corroded from the cut surface and the fuse element thus expands, resulting in cracking of the insulating film formed on the fuse element. Further, a problem arises in that the crack becomes a penetration route of the moisture, and hence the corrosion progresses inside the semiconductor device.

SUMMARY OF THE INVENTION

The present invention has been made in view of the above-mentioned problems, and provides a semiconductor device including a fuse element that can suppress progress of corrosion from a cut portion of the fuse element.

In order to solve the above-mentioned problems, according to one embodiment of the present invention, there is provided a semiconductor device including a fuse element that can be cut by a laser, the fuse element including a fuse element portion to be removed by the laser irradiation and a fuse element portion that remains after the laser irradiation. The fuse element portions have different structures so that a sectional area of the fuse element exposed from a cut surface formed by the laser irradiation is small.

According to one embodiment of the present invention, there can be provided a fuse element in which the corrosion due to the penetration of moisture is prevented from progressing inside the semiconductor device as follows. Specifically, after the fuse element is cut by a laser, the sectional area of the fuse element exposed from the cut surface is small, and hence a volume of the fuse element to be expanded is small even if the exposed portion of the fuse element is corroded. Thus, stress to be applied to the fuse protective insulating film is suppressed and the fuse protective insulating film does not crack, which prevents the formation of the new moisture penetration route.

DETAILED DESCRIPTION OF THE PREFERRED EMBODIMENTS

Now, various embodiments of the present invention are described with reference to the drawings.

First Embodiment

Figure 1:
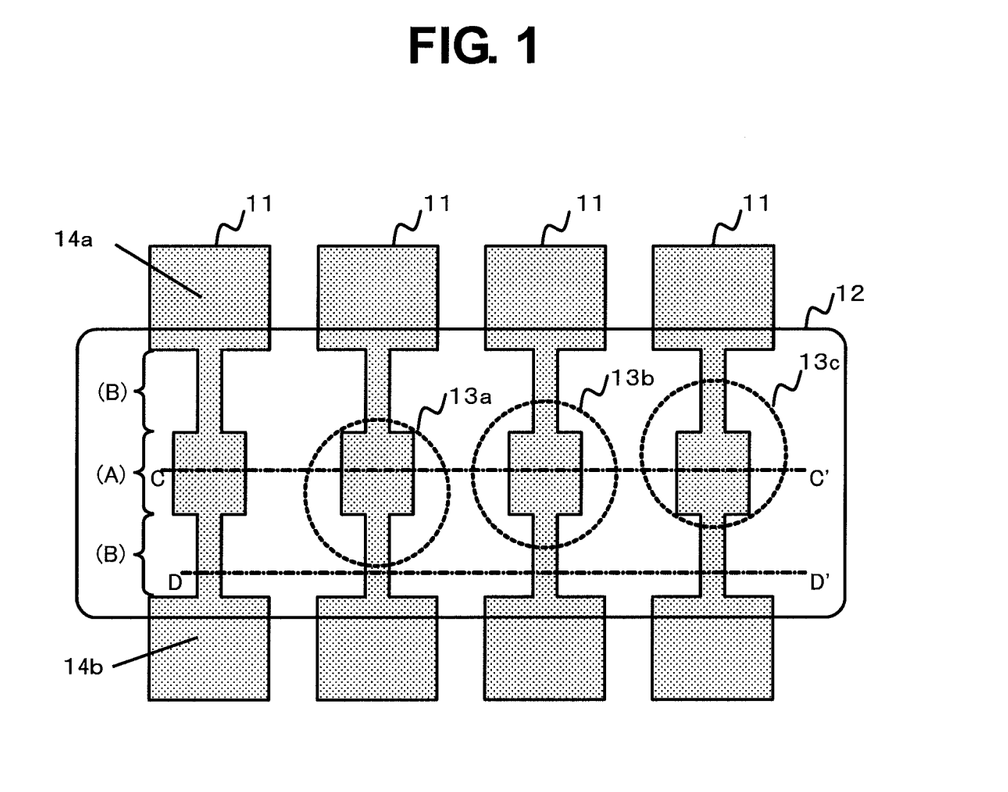
FIG. 1 is a plan view illustrating a semiconductor device according to a first embodiment of the present invention.

FIG. 1 is a plan view illustrating a semiconductor device according to a first embodiment of the present invention. A plurality of fuse elements 11 are arranged in parallel, and both ends of each of the fuse elements 11 correspond to first terminals 14a and second terminals 14b, respectively. The respective fuse elements are connected to a circuit via the first and second terminals 14a and 14b. The circuit determines whether or not a current flows between the terminals 14a and 14b. At the fuse element 11 that is not cut, the current flows between the terminals 14a and 14b. A dimension of the fuse element in a direction perpendicular to the current flow is referred to as a width of the fuse element. In FIG. 1, a direction perpendicular to a direction connecting the terminals 14a and 14b corresponds to the width of the fuse element.

A fuse insulating protective film opening region 12 is arranged on a region including the centers of the fuse elements 11 in order to perform cutting by a laser. The fuse protective insulating film opening region 12 is a region from which a protective insulating film (described later), for example, a silicon nitride film arranged on an upper portion of the semiconductor device is removed. In this case, each of the fuse elements 11 does not have a constant width but has portions of different widths, which are represented by (A) and (B) of FIG. 1. In the following, the region of the fuse element 11 represented by (A) is referred to as a large sectional area region, whereas the region of the fuse element 11 represented by (B) is referred to as a small sectional area region, and opposed sides of the large sectional area region (A) are connected to respective small sectional area regions (B).

The large sectional area regions (A) correspond to large width portions of the fuse elements 11 and are portions to be irradiated with laser spots 13a, 13b, and 13c, respectively, when the cutting by the laser is performed. At the time of the laser irradiation, the alignment is shifted depending on a spot diameter and alignment accuracy of the laser. For example, positions of spots may be shifted as the laser spots 13a, 13b, and 13c illustrated in FIG. 1. The large sectional area region (A) of the fuse element 11 is designed so that the region is reliably within the laser spot 13 even if the position of the spot is shifted. A width of the large sectional area region (A) is determined taking into account the spot diameter of the laser.

Further, the small sectional area region (B) corresponds to a small width portion of the fuse element 11 and is a region to be exposed from the cut surface when the fuse element 11 is cut by the laser. The fuse element 11 is exposed from the cut surface, and hence the small sectional area region (B) is designed to be narrow compared to the large sectional area region (A) in order to reduce the exposed surface of the fuse element 11 as much as possible.

Figure 2A:
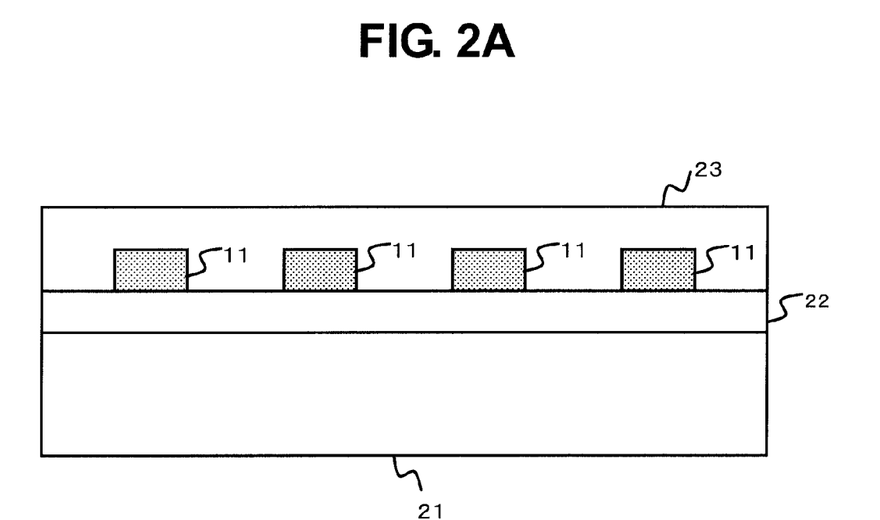
FIGS. 2A and 2B are sectional views illustrating the semiconductor device according to the first embodiment of the present invention.
Figure 2B:
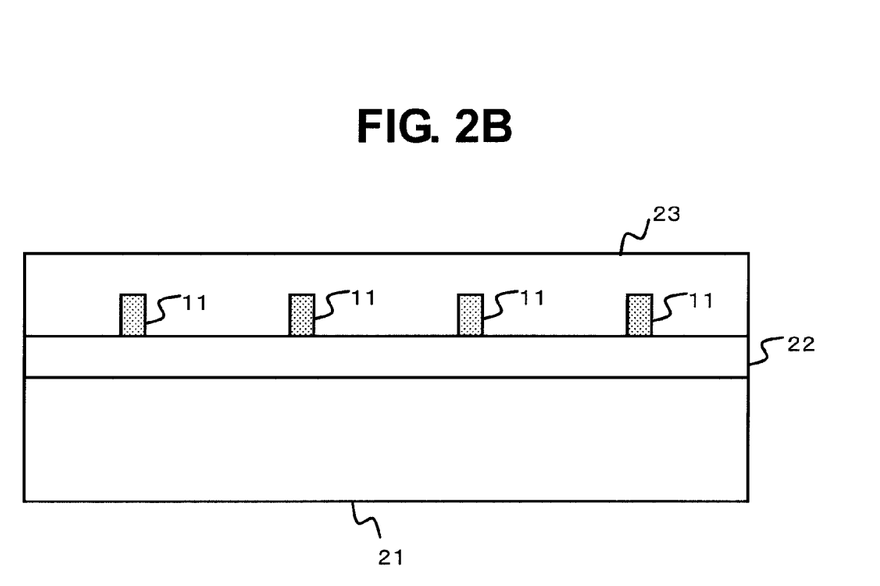

FIG. 2A is a sectional view taken along the line C-C' of FIG. 1, and FIG. 2B is a sectional view taken along the line D-D' of FIG. 1. An insulating film 22 is arranged on a silicon substrate 21, and the fuse elements 11 are arranged on the insulating film 22. Further, a fuse protective insulating film 23 is arranged on an upper portion of the fuse elements 11. The fuse protective insulating film 23 needs to have a certain thickness in order to play a role of protecting the fuse elements 11 against the penetration of moisture from the upper portion. The thickness of the fuse protective insulating film is set taking into account a use environment and conditions of the semiconductor device.

The large sectional area region (A) of the fuse element 11 of FIG. 2A, that is, a region to be cut by the laser, needs to have a certain width and thickness. When the cutting by the laser is performed, the fuse element 11 irradiated with the laser expands due to the heat to blow off the fuse protective insulating film 23 arranged on the upper portion of the fuse element 11, thereby forming an opening in the fuse protective insulating film 23. Then, the fuse element 11 vaporizes and disappears to be cut. Because the fuse protective insulating film 23 needs to have a certain thickness in order to prevent the moisture from penetration, if a portion of the fuse element 11 to be cut by the laser does not have a certain volume, explosion force to be generated by the laser irradiation is weak and the fuse protective insulating film 23 can thus not be stably blown off. Therefore, the large sectional area region (A) needs to have the certain width and thickness for securing the sufficient volume.

Further, the small sectional area region (B) becomes the exposed surface after the cutting by the laser, and thus has no protection against the penetration of moisture. A series of causes leading to the corrosion occurs as follows: the cut surface is affected by corrosion, the fuse element 11 expands, stress is applied to the fuse protective insulating film 23, the fuse protective insulating film 23 cracks, and the crack becomes a penetration route of the moisture. However, the present invention can suppress progress of the corrosion as follows. Specifically, the width of the small sectional area region (B) that becomes the cut surface formed by the laser is set to be small so that the exposed area is small, and hence the stress of the exposed portion due to the corrosion is weak to suppress the cracking of the fuse protective insulating film 23, which prevents the new moisture penetration route from being formed inside the semiconductor device.

As described above, by using the present invention, it is possible to provide the semiconductor device including the fuse element that can be cut by the laser, which can suppress the influence of the corrosion progressing from the cut surface formed by the laser.

Second Embodiment

Next, a semiconductor device according to a second embodiment of the present invention is described with reference to the drawings.

Figure 3:
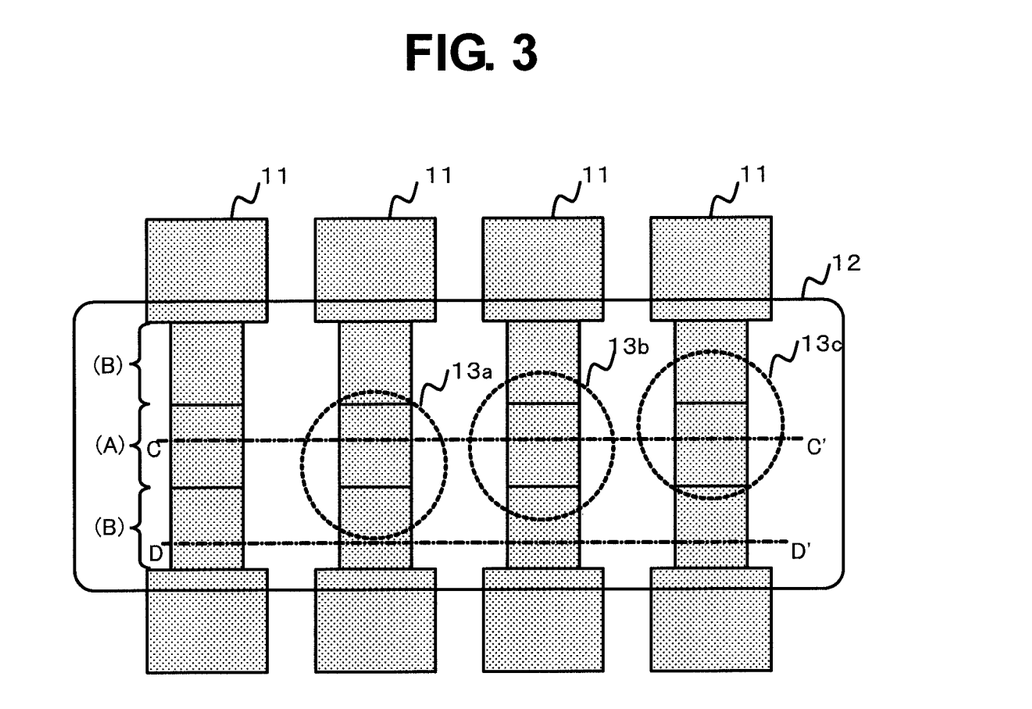
FIG. 3 is a plan view illustrating a semiconductor device according to a second embodiment of the present invention.

FIG. 3 is a plan view illustrating the semiconductor device according to the second embodiment of the present invention. The fuse elements 11 are arranged, and the fuse protective insulating film opening region 12 is arranged over the centers of the fuse elements 11 in order to perform the cutting by the laser. The fuse protective insulating film opening region 12 is a region from which the protective film, for example, a silicon nitride film arranged on the upper portion of the semiconductor device is removed. Further, the fuse element 11 includes two regions of the large sectional area region (A) and the small sectional area region (B) as illustrated in FIG. 3.

The large sectional area regions (A) correspond to thick portions of the fuse elements 11 and are portions to be irradiated with the laser spots 13 when the cutting by the laser is performed. At the time of the laser irradiation, the alignment is shifted depending on a spot diameter and alignment accuracy of the laser. For example, positions of spots may be shifted as the laser spots 13a, 13b, and 13c illustrated in FIG. 3. The large sectional area region (A) of the fuse element 11 is designed so that the region is reliably within the laser spot 13 even if the position of the spot is shifted. A width of the large sectional area region (A) is determined taking into account the spot diameter of the laser.

Further, the small sectional area region (B) corresponds to a thin portion of the fuse element 11 and is a region to be exposed from the cut surface when the fuse element 11 is cut by the laser. The fuse element 11 is exposed from the cut surface, and hence the small sectional area region (B) is designed to be thin compared to the large sectional area region (A) in order to reduce the exposed surface of the fuse element 11 as much as possible.

Figure 4A:
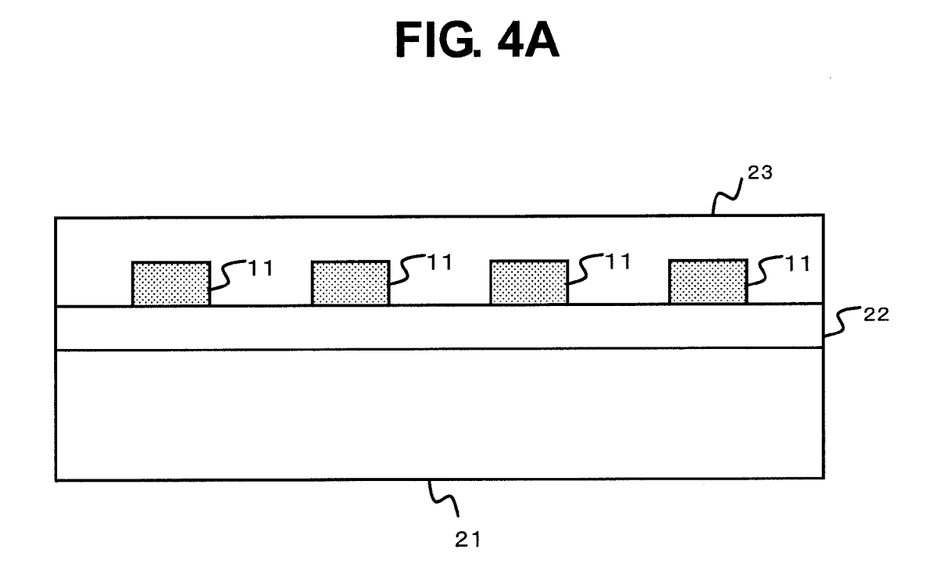
FIGS. 4A and 4B are sectional views illustrating the semiconductor device according to the second embodiment of the present invention.
Figure 4B:
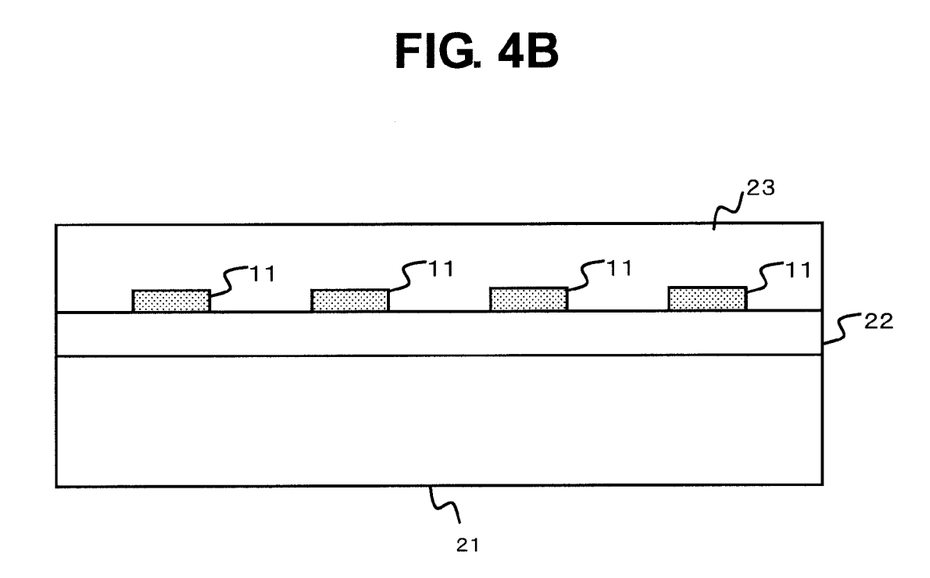

FIG. 4A is a sectional view taken along the line C-C' of FIG. 3, and FIG. 4B is a sectional view taken along the line D-D' of FIG. 3. The insulating film 22 is arranged on the silicon substrate 21, and the fuse elements 11 are arranged on the insulating film 22. Further, the fuse protective insulating film 23 is arranged on an upper portion of the fuse elements 11. The fuse protective insulating film 23 needs to have a certain thickness in order to play a role of protecting the fuse elements 11 against the penetration of moisture from the upper portion. The thickness of the fuse protective insulating film is set taking into account a use environment and conditions of the semiconductor device.

The large sectional area region (A) of the fuse element 11 of FIG. 4A, that is, a region to be cut by the laser, needs to have a certain width and thickness. When the cutting by the laser is performed, the fuse element 11 irradiated with the laser expands due to the heat to blow off the fuse protective insulating film 23 arranged on the upper portion of the fuse element 11, thereby forming an opening in the fuse protective insulating film 23. Then, the fuse element 11 vaporizes and disappears to be cut. Because the fuse protective insulating film 23 needs to have a certain thickness in order to prevent the moisture from penetration, if a portion of the fuse element 11 to be cut by the laser does not have a certain volume, explosion force to be generated by the laser irradiation is weak and the fuse protective insulating film 23 can thus not be stably blown off. Therefore, the large sectional area region (A) needs to have the certain width and thickness for securing the sufficient volume.

Further, the small sectional area region (B) becomes the exposed surface after the cutting by the laser, and thus has no protection against the penetration of moisture. A series of causes leading to the corrosion occurs as follows: the cut surface is affected by corrosion, the fuse element 11 expands, stress is applied to the fuse protective insulating film 23, the fuse protective insulating film 23 cracks, and the crack becomes a penetration route of the moisture. However, the present invention can suppress progress of the corrosion as follows. Specifically, the thickness of the small sectional area region (B) that becomes the cut surface formed by the laser is set to be small so that the exposed area is small, and hence the stress of the exposed portion due to the corrosion is weak to suppress the cracking of the fuse protective insulating film 23, which prevents the new moisture penetration route from being formed inside the semiconductor device.

Third Embodiment

Next, a semiconductor device according to a third embodiment of the present invention is described with reference to the drawings.

Figure 5:
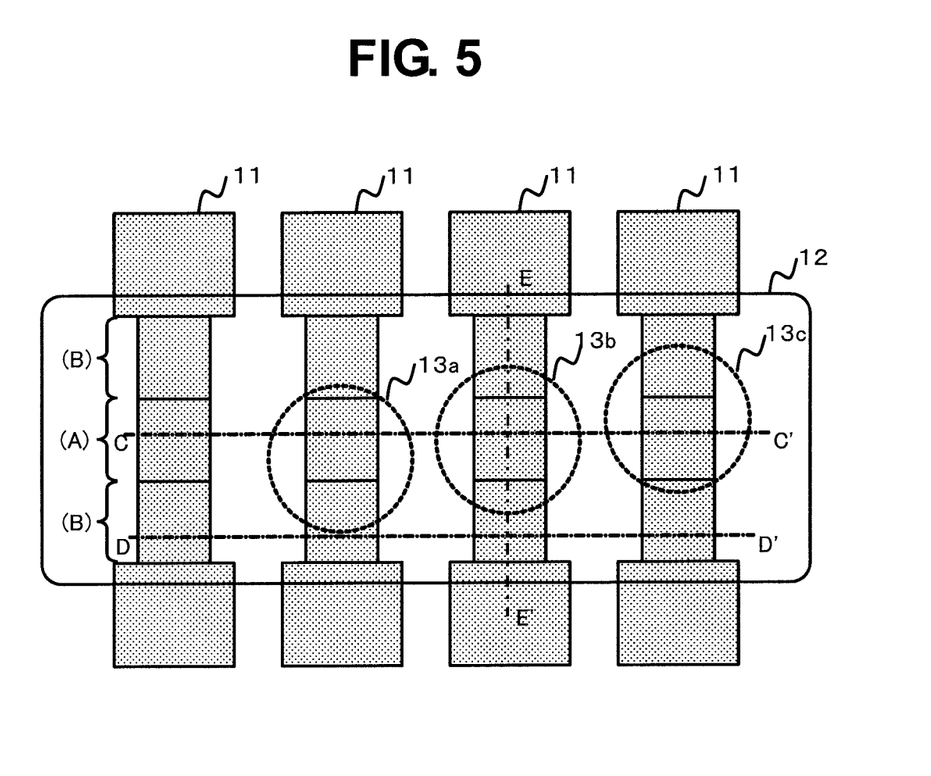
FIG. 5 is a plan view illustrating a semiconductor device according to a third embodiment of the present invention.

This embodiment is a modified example of the second embodiment. As illustrated in FIG. 5, a planar structure of the semiconductor device according to the third embodiment of the present invention is the same as that of FIG. 3. That is, the semiconductor device includes the fuse element 11 including the thick portion and the thin portion. However, as illustrated in FIGS. 6A, 6B, and 6C, the semiconductor device of this embodiment has a different structure from that of the second embodiment in a sectional view.

Figure 6A:
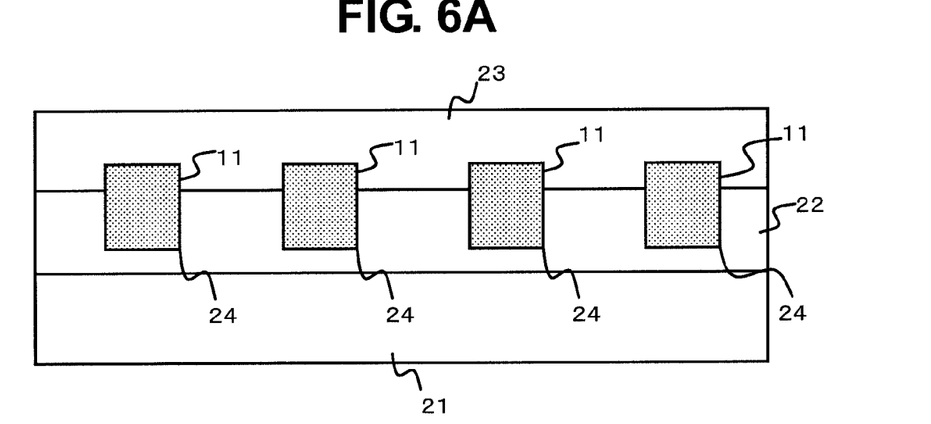
FIGS. 6A, 6B, and 6C are sectional views illustrating the semiconductor device according to the third embodiment of the present invention.

FIG. 6A is a sectional view taken along the line C-C' of FIG. 5, illustrating the thick portion. The insulating film 22 is formed on the silicon substrate 21, and trenches 24 are formed in the insulating film 22. Each of the trenches 24 is filled with a conductive film, to thereby form a part of the thick portions of the respective fuse elements 11. Note that, the fuse element 11 upwardly protrudes from the trench so that an upper surface thereof is placed above an upper surface of the insulating film 22. In addition, the upwardly protruding portions of the fuse elements 11 and the upper portion of the insulating film 22 are covered by the fuse protective insulating film 23.

Figure 6B:
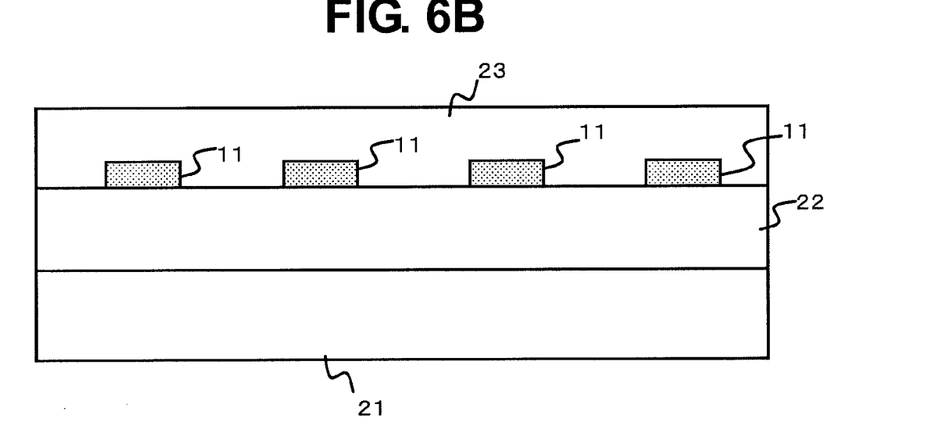

FIG. 6B is a sectional view taken along the line D-D' of FIG. 5, illustrating the thin portion. The insulating film 22 is formed on the silicon substrate 21, and a plurality of the thin portions of the fuse elements 11 are formed on the insulating film 22. In addition, the fuse elements 11 and the upper portion of the insulating film 22 are covered by the fuse protective insulating film 23.

Figure 6C:
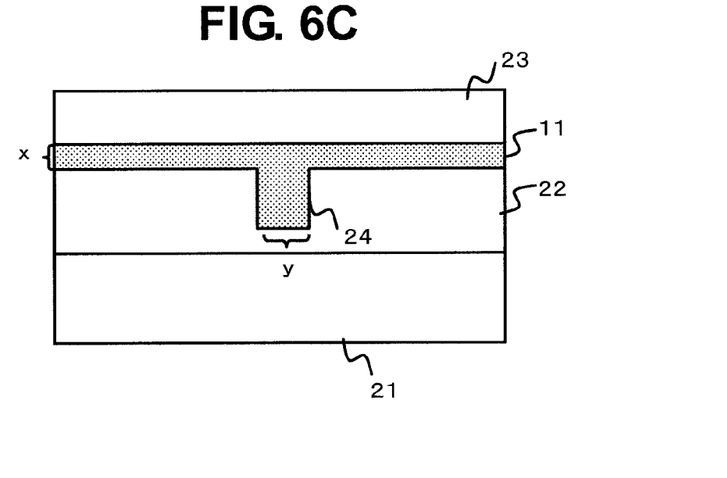

FIG. 6C is a sectional view taken along the line E-E' of FIG. 5. FIG. 6C illustrates the fuse element 11 including the thick portion formed of the trench 24 filled with the conductive film and the thin portions formed on both sides of the thick portion. The conductive film of polysilicon containing impurities or the like is formed by using LPCVD in general. When a trench width y corresponding to a width of the thick portion and a film thickness x of the thin portions of the conductive film each adjacent to corresponding one of the both sides of the thick portion satisfy y≤2x, the conductive film can be sufficiently filled into the trench. Consequently, the fuse elements 11 illustrated in FIGS. 6A, 6B, and 6C are easily formed.

The fuse protective insulating film 23 needs to have a certain thickness in order to play a role of protecting the fuse elements 11 against the penetration of moisture from the upper portion. The thickness of the fuse protective insulating film is set taking into account a use environment and conditions of the semiconductor device.

The large sectional area region (A) of the fuse element 11 of FIG. 6A, that is, a region to be cut by the laser, needs to have a certain width and thickness. When the cutting by the laser is performed, the fuse element 11 irradiated with the laser expands due to the heat to blow off the fuse protective insulating film 23 arranged on the upper portion of the fuse element 11, thereby forming an opening in the fuse protective insulating film 23. Then, the fuse element 11 vaporizes and disappears to be cut. Because the fuse protective insulating film 23 needs to have a certain thickness in order to prevent the moisture from penetration, if a portion of the fuse element 11 to be cut by the laser does not have a certain volume, explosion force to be generated by the laser irradiation is weak and the fuse protective insulating film 23 can thus not be stably blown off. Therefore, the large sectional area region (A) needs to have the certain width and thickness for securing the sufficient volume.

Further, the small sectional area region (B) becomes the exposed surface after the cutting by the laser, and thus has no protection against the penetration of moisture. A series of causes leading to the corrosion occurs as follows: the cut surface is affected by corrosion, the fuse element 11 expands, stress is applied to the fuse protective insulating film 23, the fuse protective insulating film 23 cracks, and the crack becomes a penetration route of the moisture. However, the present invention can suppress progress of the corrosion as follows. Specifically, the thickness of the small sectional area region (B) that becomes the cut surface formed by the laser is set to be small so that the exposed area is small, and hence the stress of the exposed portion due to the corrosion is weak to suppress the cracking of the fuse protective insulating film 23, which prevents the new moisture penetration route from being formed inside the semiconductor device.

What is claimed is:

1. A semiconductor device, comprising a fuse element for laser cutting,
   the fuse element being arranged on an insulating film formed on a silicon substrate and being covered by a protective insulating film,
   the fuse element comprising:

a large sectional area region having opposed sides; and small sectional area regions each connected to and adjacent to one of the sides of the large sectional area region so that the large sectional area region is connected between the small sectional area regions, the large sectional area region comprising a thick portion, and each of the small sectional area regions comprising a thin portion, the thick portion being thicker than the thin portion, and the large sectional area region being configured to be irradiated with a laser when laser cutting the fuse element to remove the large sectional area region and expose cut surfaces of the small sectional areas regions.

2. The semiconductor device according to claim 1 wherein the thick portion is formed in a trench formed in the insulating film.

3. The semiconductor device according to claim 2, wherein a width of the trench is equal to or less than twice the thickness of the thin portion.

4. A semiconductor device comprising:

an insulating film disposed on a silicon substrate;

a fuse element arranged on the insulating film, the fuse element having two spaced-apart terminals, a large sectional area region, and two small sectional area regions connecting the large sectional area region to respective ones of the terminals; and a protective insulating film formed over the insulating film and covering the fuse element, wherein the large sectional area region comprises a thick portion and each of the small sectional area regions comprises a thin portion, and the thick portion is thicker than the thin portion, and the large sectional area region is configured to be cut by laser irradiation that removes both the irradiated portion of the protective insulating film covering the large sectional area region and the large sectional area region thereby exposing cut surfaces of the small sectional area regions.

5. The semiconductor device according to claim 4; wherein the thick portion is formed in a trench formed in the insulating film.

6. The semiconductor device according to claim 5; wherein a width of the trench is equal to or less than twice the thickness of the thin portion.

7. The semiconductor device according to claim 4; wherein the fuse element comprises a plurality of fuse elements arranged side by side on the insulating film.

\* \* \* \* \*